(12) United States Patent
Machida et al.

(10) Patent No.: US 6,716,664 B2
(45) Date of Patent: Apr. 6, 2004

(54) FUNCTIONAL DEVICE AND METHOD OF MANUFACTURING THE SAME

(75) Inventors: Akio Machida, Kanagawa (JP); Dharam Pal Gosain, Kanagawa (JP); Setsuo Usui, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/391,811

(22) Filed: Mar. 20, 2003

(65) Prior Publication Data

US 2003/0173601 A1 Sep. 18, 2003

Related U.S. Application Data

(62) Division of application No. 09/889,603, filed as application No. PCT/JP00/08210 on Nov. 21, 2000, now Pat. No. 6,570,223.

(30) Foreign Application Priority Data

Nov. 22, 1999 (JP) .......................... P11-374560
May 19, 2000 (JP) ...................... P2000-188478

(51) Int. Cl.⁷ .................. H01L 51/40; H01L 21/00; H01L 21/20; H01L 21/31; H01L 27/01
(52) U.S. Cl. .................... 438/99; 438/82; 438/149; 438/478; 438/780; 257/347; 257/350; 257/354; 257/345; 257/59; 257/257; 257/72; 257/65; 257/66; 257/13; 257/56; 257/64; 257/61; 257/67; 257/1
(58) Field of Search .................. 438/82, 99, 149, 438/478, 780; 257/347, 350, 354, 345, 59, 72, 65, 66, 13, 56, 64, 61, 67, 1

(56) References Cited

U.S. PATENT DOCUMENTS 4,639,277 A * 1/1987 Hawkins ................ 148/33.3
5,347,144 A * 9/1994 Garnier et al. ............ 257/40
5,998,804 A * 12/1999 Suh et al. ................. 257/40
6,566,156 B1 * 5/2003 Sturm et al. .............. 438/35
6,621,098 B1 * 9/2003 Jackson et al. ........... 257/40

FOREIGN PATENT DOCUMENTS

| JP | 59079518 | 5/1984 |
| JP | 09270525 | 10/1997 |
| JP | 10173194 | 6/1998 |

* cited by examiner

Primary Examiner—John Nebling
Assistant Examiner—Stanetta Isaac
(74) Attorney, Agent, or Firm—Sonnenschein, Nath & Rosenthal LLP

(57) ABSTRACT

A functional device free from cracking and having excellent functional characteristics, and a method of manufacturing the same are disclosed. A low-temperature softening layer (12) and a heat-resistant layer (13) are formed in this order on a substrate (11) made of an organic material such as polyethylene terephthalate, and a functional layer (14) made of polysilicon is formed thereon. The functional layer (14) is formed by crystallizing an amorphous silicon layer, which is a precursor layer, with laser beam irradiation. When a laser beam is applied, heat is transmitted to the substrate (11) and the substrate (11) tends to expand. However, a stress caused by a difference in a thermal expansion coefficient between the substrate (11) and the functional layer (14) is absorbed by the low-temperature softening layer (12), so that no cracks and peeling occurs in the functional layer (14). The low-temperature softening layer (12) is preferably made of a polymeric material containing an acrylic resin. By properly interposing a metal layer and a heat-resistant layer between the substrate (11) and the functional layer (14), a laser beam of higher intensity can be irradiated.

17 Claims, 8 Drawing Sheets

FUNCTIONAL DEVICE AND METHOD OF MANUFACTURING THE SAME

This application is a divisional application of U.S. application Ser. No. 09/889,603, filed Oct. 2, 2001, now is U.S. Pat. No. 6,570,223, which is a National Stage entry of PCT/JP00/08210 filed Nov. 21, 2000, which claims priority from Japanese Patent Application No. P11-374560 filed Nov. 22, 1999, the contents of which are herein incorporated by reference to the extent allowed by law.

TECHNICAL FIELD

The present invention relates to a functional device having a functional layer, such as a thin film transistor, a dielectric capacitor, or a solar battery, and a method of manufacturing the same.

BACKGROUND ART

Since the pn junction of a hydrogenated amorphous silicon was developed in 1976, the hydrogenated amorphous silicon has been being actively studied. The hydrogenated amorphous silicon has a structure in which a dangling bond in a network made of silicon is terminated by hydrogen or fluorine, and its film can be formed at a low temperature equal to or lower than 300° C. Consequently, the film can be formed on a cheap glass substrate. A study is being made to apply the hydrogenated amorphous silicon to a functional device such as a thin film transistor (TFT), a solar cell, or an optical sensor.

However, when the hydrogenated amorphous silicon is used as it is, in the case of a TFT, only carrier mobility as low as about 0.1 to 0.5 $cm^2/V \cdot s$ can be obtained. In the case of a solar cell, there are drawbacks such that doping efficiency is lower as compared with the case of using polycrystalline silicon (polysilicon), and photoelectric conversion efficiency deteriorates due to an increase in series resistance. In recent years, a method of solving the problems by irradiating amorphous silicon formed on a glass substrate with an energy beam such as excimer laser beam so as to be crystallized is being studied. Recently, crystallization of not only semiconductors but also oxides performed by irradiation of an energy beam is also being studied.

In the functional devices, a substrate for supporting a functional layer made of silicon, oxide, or the like is required to be light, shock-resistant, and flexible so as not to be broken when some stress is applied. Conventionally, a silicon substrate, a glass substrate, or the like is used. Recently, it is proposed to use a substrate made of an organic material such as polyethylene terephthalate (PET) which is lighter and more shock-resistant (refer to Japanese Unexamined Patent Application Nos. 8-186267, 10-144930, and 10-144931).

An organic material substrate has, however, a thermal expansion coefficient higher than that of a glass substrate or a silicon substrate. For example, as shown in FIG. 14, when a functional layer 103 is crystallized by being irradiated with an energy beam, there are problems such that a substrate 101 expands by a heat conduction via a heat-resistant layer 102 to the substrate 101, a very large stress instantaneously works on the functional layer 103, a crack occurs and, in a worse case, peeling occurs. In the case of manufacturing a functional device by using the organic material substrate, therefore, sufficient characteristics and reliability cannot be obtained.

The invention has been achieved in consideration of the problems and its object is to provide a functional device having no crack and capable of displaying excellent functional characteristics and a method of manufacturing the same.

DISCLOSURE OF INVENTION

A functional device of the invention has a functional layer provided on one of surfaces of a substrate and comprises: a heat-resistant layer which is a single layer or constructed by a plurality of layers provided between the substrate and the functional layer; and a low-temperature softening layer provided between the heat-resistant layer and the substrate and having a softening temperature lower than that of the substrate.

Another functional device according to the invention comprises: a functional layer; a low-temperature softening layer provided on one of surfaces of the functional layer and having a softening temperature of 80° C. or lower; and a heat-resistant layer which is a single layer or constructed by a plurality of layers provided between the low-temperature softening layer and the functional layer.

A method of manufacturing a functional device according to the invention, in which a functional layer is provided on a substrate, comprises the steps of: forming a low-temperature softening layer having a softening temperature lower than that of a substrate on the substrate; forming a heat-resistant layer which is a single layer or constructed by a plurality of layers on the low-temperature softening layer; and forming the functional layer on the heat-resistant layer.

In the functional device and the method of manufacturing the same according to the invention, by the low-temperature softening layer provided between the substrate and the functional layer, a stress caused by thermal expansion of the substrate is absorbed, thereby enabling occurrence of a crack and peeling in the functional layer to be prevented.

Since the another functional device according to the invention comprises the low-temperature softening layer having a softening temperature of 80° C. or lower, occurrence of a crack in the functional layer caused by a difference in thermal coefficient of expansion can be prevented.

Further, in the functional device and the method of manufacturing the same according to the invention, it is preferable to provide a warp suppression layer for suppressing a warp which occurs in association with thermal deformation of the substrate on the surface opposite to the surface on which the functional layer is provided of the substrate. The warp suppression layer may be a composite layer of a polymer layer made of an organic polymer and a heat-resistant layer which is a single layer or constructed by two or more layers. The warp suppression layer may be only a polymer layer made of an organic polymer.

Other and further objects, features and advantages of the invention will appear more fully from the following description.

BEST MODE FOR CARRYING OUT THE INVENTION

Embodiments of the invention will be described in detail hereinbelow with reference to the drawings.

First Embodiment

Figure 1:
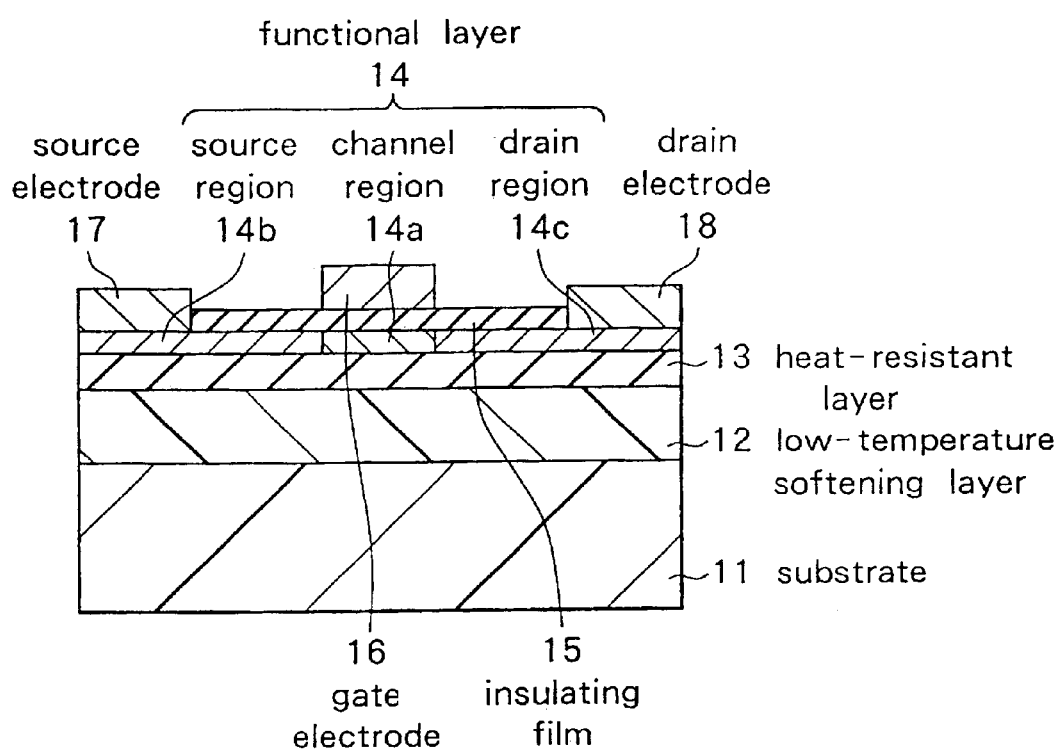
FIG. 1 is a cross section showing the configuration of a thin film transistor according to a first embodiment of the invention.

FIG. 1 shows a sectional configuration of a thin film transistor according to a first embodiment of the invention. The thin film transistor comprises, for example, on a substrate 11, a channel region 14a, a source region 14b, and a drain region 14c as a functional layer 14 sandwiching a low-temperature softening layer 12 and a heat-resistant layer 13 in this order from the side of the substrate 11. The source region 14b and the drain region 14c are provided so as to be isolated from each other and adjacent to the channel region 14a. A gate electrode 16 is formed on the channel region 14a sandwiching an insulating film 15. A source electrode 17 is electrically connected to the source region 14b, and a drain electrode 18 is electrically connected to the drain region 14c.

The substrate 11 is made of, for example, an organic material. Preferable organic materials for forming the substrate 11 are polymeric materials such as polyesters e.g. PET (polyethylene terephthalate), polyethylene naphthalate, or polycarbonate, polyolefins such as polypropylene, polyphenylene sulfides such as polyphenylene sulfide, polyamides, aromatic polyamides, polyether ketones, polyimides, acrylic resin, and PMMA (polymethyl methacrylate). Particularly, a general plastic substrate made of polyethylene terephthalate, acetate, polyphenylene sulfide, polycarbonate, PES (polyether sulfone), polystyrene, nylon, polypropylene, polyvinyl chloride, acrylic resin, PMMA, or the like can be suitably used.

The substrate 11 is preferably thin and has a thickness of, for example, about 200 $\mu$m to give the device flexibility and to reduce the size of the device.

The low-temperature softening layer 12 has a thickness of, for example, about 30 $\mu$m and is made of an organic material having a softening temperature lower than that of the substrate 11. For example, when the substrate 11 is made of any of the above-described organic materials, the softening temperature of the substrate 11 is generally 90° C. or higher. It is therefore preferable that the organic material of the low-temperature softening layer 12 has a softening temperature of 80° C. or lower. Examples of the organic material are polymeric materials containing an acrylic resin. Concretely, butyl acrylate or isobutyl acrylate is suitably used. The low-temperature softening layer 12 may have, for example, a multilayer structure made of the organic materials or a composite layer including a resin of the other kind.

The low-temperature softening layer 12 may be formed by any of coating methods such as gravure coating, reverse coating, kiss mayer coating, comma doctor coating, and slot die coating or may be adhered as a film.

The heat-resistant layer 13 has a thickness of, for example, about 300 nm and is made of a material having thermal conductivity lower than that of the functional layer 14. In this case, the heat-resistant layer 13 is made of silicon oxide ($SiO_x$), silicon nitride ($SiN_x$), silicon oxynitride ($SiO_xN_y$), or the like or has a multilayer structure of those materials. Silicon carbon (SiC), DLC (Diamond Like Carbon), or the like may be also used.

Each of the channel region 14a, source region 14b and drain region 14c is made of, for example, polysilicon, thereby enabling high carrier mobility to be obtained. The polycrystal includes what is called a quasi-single crystal described in the specification of Japanese Patent Application No. 9-30552. The quasi-single crystal is constructed by a plurality of crystal grains each of which is a single crystallite. The crystal grains are preferably oriented in a direction of one crystallographic plane and neighboring crystal grains are lattice-matched at least in a part of the grain boundary.

In each of the source region 14b and the drain region 14c, for example, both regions are doped with an n-type impurity such as phosphorus (P). Each of the channel region 14a, source region 14b, and drain region 14c has a thickness of, for example, about 30 nm. The insulating film 15 is made of, for example, silicon dioxide. Each of the gate electrode 16, source electrode 17, and drain electrode 18 is made of, for example, aluminum (Al).

Figure 2A:
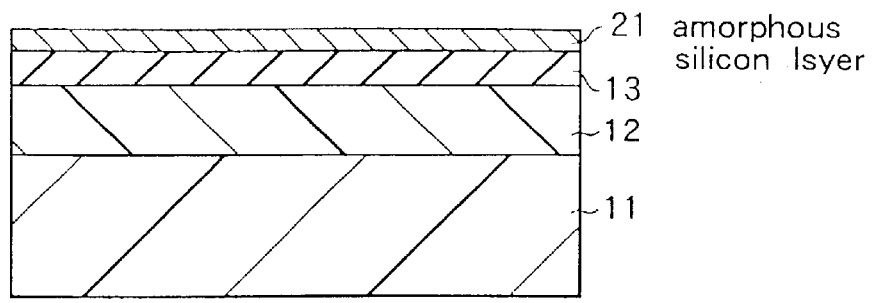
FIGS. 2A, 2B, and 2C are cross sections each showing a manufacturing process of the thin film transistor shown in FIG. 1.
Figure 2B:
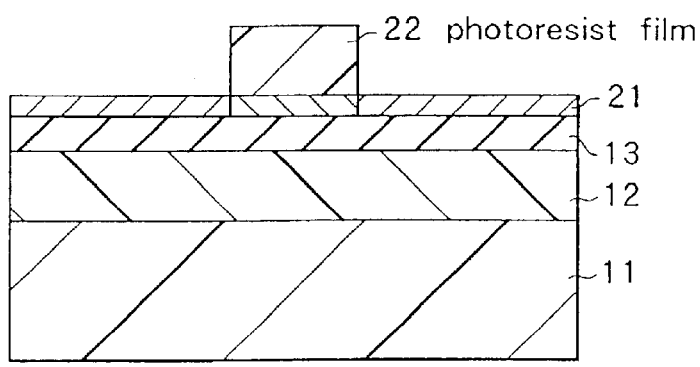
Figure 2C:
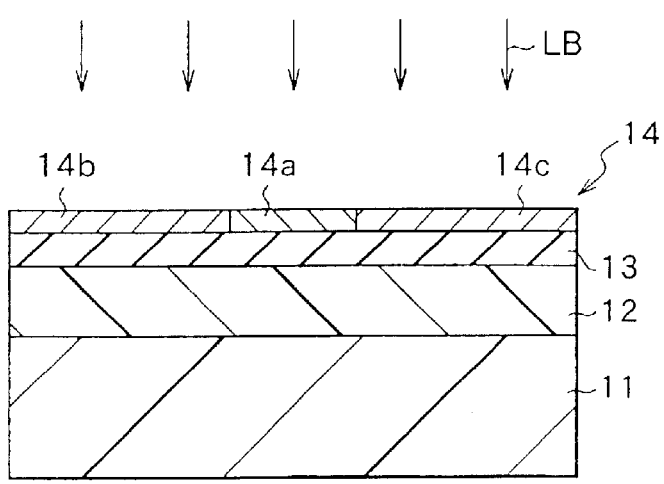

Referring to FIGS. 2A, 2B, and 2C, a method of manufacturing the thin film transistor will be described.

First, as shown in FIG. 2A, the low-temperature softening layer 12 is formed on the substrate 11 by a coating method such as gravure coating, reverse coating, kiss mayer coating, comma doctor coating, or slot die coating. Subsequently, for example, the substrate 11 on which the low-temperature softening layer 12 is formed is stamped into a predetermined shape, cleaned, and dried. Then the heat-resistant layer 13 is formed on the low-temperature softening layer 12 by, for example, reactive sputtering. After that, an amorphous silicon layer 21 is formed as a precursor layer of the functional layer 14 on the heat-resistant layer 13 by, for example, sputtering.

After forming the amorphous silicon layer 21, for example, as shown in FIG. 2B, a photoresist film 22 having openings corresponding to areas which become the source region 14b and the drain region 14c, respectively, is formed on the amorphous silicon layer 21. For example, by using the photoresist film 22 as a mask, the amorphous silicon layer 21 is exposed to an atmosphere containing an ionized gas of phosphine ($PH_3$) to dope phosphorus to the areas which become the source region 14b and the drain region 14c. After doping phosphorus, the photoresist film 22 is removed.

After removing the photoresist film 22, for example, as shown in FIG. 2C, the amorphous silicon layer 21 is irradiated with a laser beam LB so as to be heated in a nitrogen gas ($N_2$) atmosphere. By the operation, the amorphous silicon layer 21 is crystallized, and the functional layer 14, that is, the channel region 14a, source region 14b, and drain region 14c are formed. In this case, as the laser beam LB, it is preferable to use an excimer laser beam. The wavelength may be any of 350 nm of XeF, 308 nm of XeCl, 248 nm of KrF, 193 nm of ArF, and the like. In the case of using a laser beam of a short wavelength such as an excimer laser beam, the energy density is preferably set to 80 mJ/cm$^2$ or higher, so that the amorphous silicon layer 21 can be sufficiently heated, and the functional layer 14 having excellent crystallinity can be obtained.

Heat generated in the amorphous silicon layer 21, that is, the functional layer 14 by the irradiation of the laser beam LB conducts toward the substrate 11. However, since the heat-resistant layer 13 having low thermal conductivity is provided between the functional layer 21 and the substrate 11, the heat conduction toward the substrate 11 is suppressed by the heat-resistant layer 13.

In this case, the low-temperature softening layer 12 which softens at a lower temperature as compared with the substrate 11 is provided between the heat-resistant layer 13 and the substrate 11. Consequently, by the heat conduction through the heat-resistant layer 13, the low-temperature softening layer 12 softens, and slowly hardens again. A stress caused due to a difference of the thermal expansion coefficient between the substrate 11 and the functional layer 14 is therefore absorbed by the low-temperature softening layer 12, so that occurrence of a crack in the functional layer 14 and peeling of the functional layer 14 is prevented.

After forming the functional layer 14, as shown in FIG. 1, the insulating film 15 is formed on the functional layer 14 by, for example, reactive sputtering. Contact holes corresponding to the source and drain are formed in the insulating film 15 and then the gate electrode 16, source electrode 17, and drain electrode 18 are formed by, for example, deposition.

In the embodiment as described above, the low-temperature softening layer 12 is formed between the substrate 11 and the functional layer 14. Consequently, even when the laser beam LB is applied at the time of forming the functional layer 14, the stress which occurs due to the thermal expansion of the substrate 11 is absorbed by the low-temperature softening layer 12, so that occurrence of a crack and peeling in the functional layer 14 can be prevented. Thus, the excellent functional layer 14 made of polysilicon can be formed on the substrate 11 made of an organic material at high yield. Therefore, a light, shock-resistant thin film transistor having excellent characteristics can be obtained.

Figure 3:
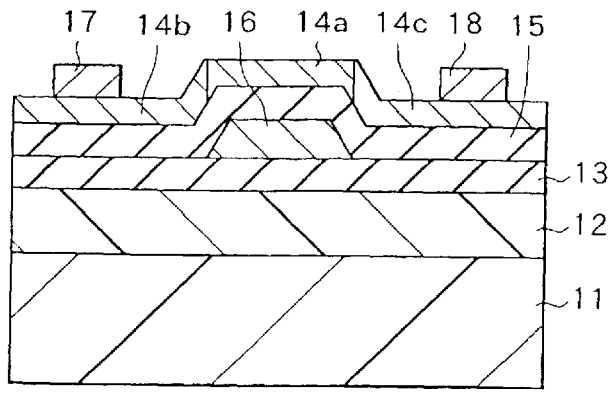
FIG. 3 is a cross section showing a modification of the thin film transistor illustrated in FIG. 1.

Although the thin film transistor in which the channel region 14a, insulating film 15, and gate electrode 16 are provided sequentially on the substrate 11 has been described in the embodiment, as shown in FIG. 3, the gate electrode 16, insulating film 15, and channel region 14a may be provided in this order on the substrate 11. In this case as well, effects similar to those of the foregoing embodiment can be obtained.

Second Embodiment

Figure 4:
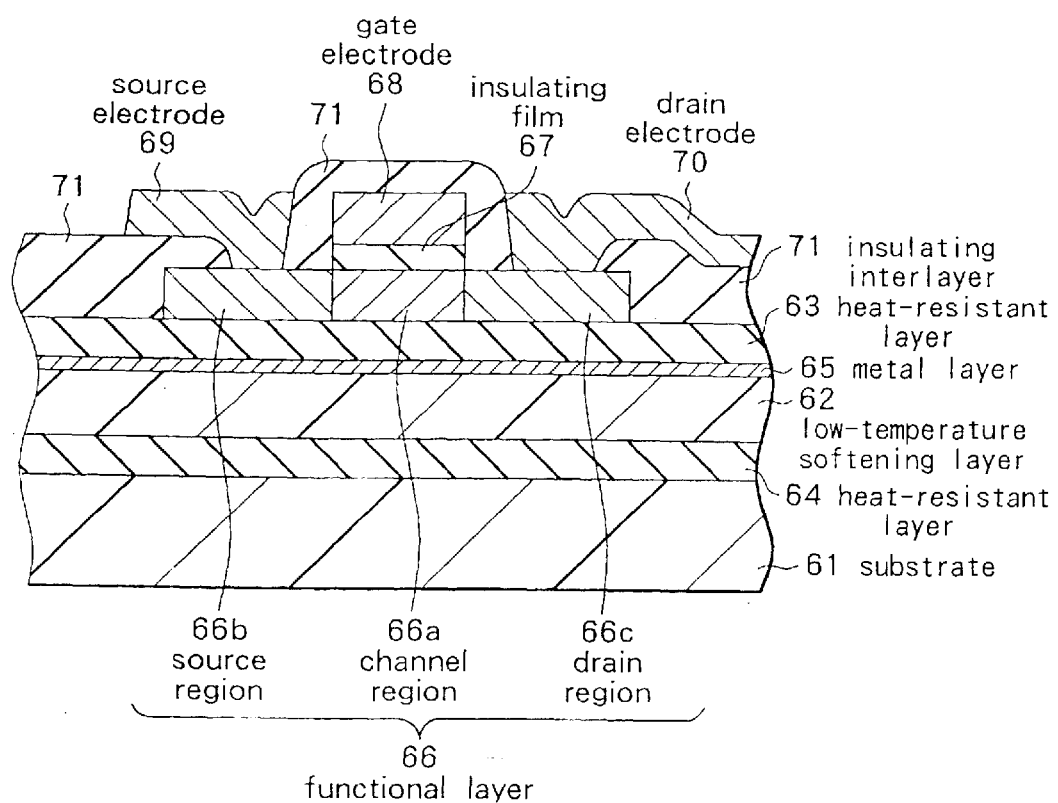
FIG. 4 is a cross section showing the configuration of a thin film transistor according to a second embodiment of the invention.

FIG. 4 shows a sectional configuration of a thin film transistor according to a second embodiment of the invention. In the thin film transistor, for example, between a substrate 61 and a functional layer 66, a heat-resistant layer 64, a low-temperature softening layer 62, a metal layer 65, and a heat-resistant layer 63 are sequentially stacked. The heat-resistant layer 63 is provided on the top surface of the low-temperature softening layer 62 in a manner similar to the first embodiment, and the heat-resistant layer 64 is provided on the under surface of the low-temperature softening layer 62. The heat-resistant layers 63 and 64 are made of, for example, similar materials. The functional layer 66 comprises a channel region 66a, a source region 66b, and a drain region 66c. A gate electrode 68 is formed on the channel region 66a sandwiching an insulating film 67. A source electrode 69 is electrically connected to the source region 66b, and a drain electrode 70 is electrically connected to the drain region 66c. The functional layer 66 and the electrodes 68 to 70, and the neighboring functional layers 66 are electrically insulated from each other via an insulating interlayer 71.

Since the substrate 61, low-temperature softening layer 62, and heat-resistant layers 63 and 64 correspond to the substrate 11, low-temperature softening layer 12, and heat-resistant layer 13, respectively, in the first embodiment, their detailed description will not be repeated.

The metal layer 65 is made of, for example, a metal having excellent heat conductivity. As a metal material of the metal layer 65, for example, Al is suitably used. Other than Al, Au, Ag, Cu, Pt, Ta, Cr, Mo, W, or the like can be used. The metal layer 65 may have a multilayer structure of two or more layers as the above-described heat-resistant layers 63 and 64. The plurality of metal layers 65 may be properly interposed between the plurality of heat-resistant layers 63 provided on the low-temperature softening layer 62.

It is also possible to provide one of the heat-resistant layer 64 and metal layer 65.

The functional layer 66, channel region 66a, source region 66b, and drain region 66c correspond to the functional layer 14, channel region 14a, source region 14b, and drain region 14c in the first embodiment, respectively. The insulating film 67, gate electrode 68, source electrode 69, and drain electrode 70 also correspond to the insulating film 15, gate electrode 16, source electrode 17, and drain electrode 18 in the first embodiment, respectively. In addition, in the embodiment, in order to maintain electrical insulation between the neighboring electrodes 68 to 70 and between the neighboring functional layers 66, as shown in FIG. 4, the insulating interlayer 71 is provided. The insulating interlayer 71 is made of, for example, a resin material such as silicon oxide or polyimide.

The thin film transistor having such a configuration can be manufactured by a method according to the first embodiment as follows.

First, in a manner similar to the heat-resistant layer 13, the heat insulating layer 64 is formed. In a manner similar to the low-temperature softening layer 12, the low-temperature softening layer 62 is formed. Subsequently, the metal layer 65 is formed on the low-temperature softening layer 62 by, for example, DC sputtering. Further, the heat-resistant layer 63 and the functional layer 66 are formed in a manner similar to the heat-resistant layer 13 and the functional layer 14, respectively.

Heat generated in the functional layer 66 by the irradiation of the laser beam LB conducts toward the substrate 61. However, since the heat-resistant layers 63 and 64 having low heat conductivity are provided between the functional layer 66 and the substrate 61, the heat conduction to the substrate 61 is doubly suppressed by the heat-resistant layers 63 and 64. Further, in the embodiment, since the metal layer 65 having high heat conductivity is provided between the low-temperature softening layer 62 and the heat-resistant layer 63, heat stored in the heat-resistant layers 63 and 64 dissipates through the metal layer 65.

After forming the functional layer 66, by a known method, the insulating film 67 and the gate electrode 68 are formed on the channel region 66a. After that, for example, the insulating interlayer 71 is formed on the entire surface, and contact holes are formed in the insulating interlayer 71. Finally, the source electrode 69 and the drain electrode 70 are formed. In such a manner, the thin film transistor shown in FIG. 4 is obtained.

As described above, according to the embodiment, the heat-resistant layers 63 and 64 having low heat conductivity are provided between the functional layer 66 and the substrate 61, so that the heat conduction to the substrate 61 is doubly suppressed and heat expansion of the substrate 61 can be prevented with reliability. Further, since the metal layer 65 having high heat conductivity is provided between the low-temperature softening layer 62 and the heat-resistant layer 63, heat accumulated in the heat-resistant layers 63 and 64 is dissipated through the metal layer 65, so that heat conduction to the substrate 61 can be prevented. By suppressing the thermal expansion of the substrate 61 more strongly as described above, an effect similar to that of the first embodiment can be enhanced. In other words, heating with an energy beam having higher energy density can be realized.

Third Embodiment

Figure 5:
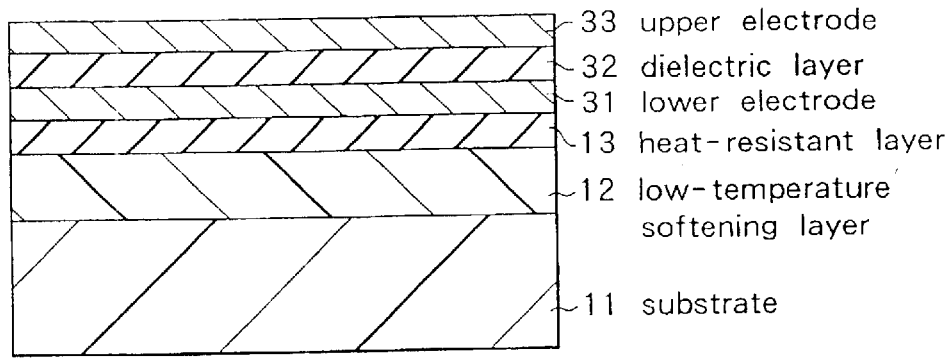
FIG. 5 is a cross section showing the configuration of a dielectric capacitor according to a third embodiment of the invention.

FIG. 5 shows a sectional configuration of a dielectric capacitor according to a second embodiment of the invention. The dielectric capacitor comprises, in a manner similar to the thin film transistor of the first embodiment, the substrate 11, low-temperature softening layer 12, and heat-resistant layer 13. The same components are designated by the same reference numerals as those of the first embodiment and their detailed description will not be repeated.

On the heat-resistant layer 13, for example, a lower electrode 31 made of indium tin oxide (ITO), a dielectric layer 32 as a functional layer, and an upper electrode 33 made of ITO are stacked in this order from the heat-resistant layer 13 side. The dielectric layer 32 is, for example, polycrystalline material and includes a ferroelectric material such as solid solution (PZT) of lead titanate ($PbTiO_3$) and lead zirconate ($PbZrO_3$), barium titanate ($BaTiO_3$), or a layered-structure oxide containing bismuth (Bi). Those ferroelectric materials do not need to have stoichiometric composition.

Referring to FIG. 5, a method of manufacturing the dielectric capacitor having such a configuration will be described.

First, in a manner similar to the first embodiment, the low-temperature softening layer 12 and the heat-resistant layer 13 are sequentially formed on the substrate 11. Subsequently, on the heat-resistant layer 13, the lower electrode 31 is formed by, for example, sputtering. On the lower electrode 31, a not-illustrated oxide layer mainly in an amorphous state is formed as a precursor layer of the dielectric layer 32 by, for example, sputtering. On the not-illustrated oxide layer, the upper electrode 33 is formed by, for example, sputtering.

After that, for example, the not-illustrated oxide layer is heated with a laser beam irradiating the upper electrode 33 side in a nitrogen gas atmosphere so as to be crystallized, thereby forming the dielectric layer 32. The parameters of the laser beam are similar to those in the first embodiment. In the second embodiment as well, as described in the first embodiment, heat conduction to the substrate 11 is suppressed by the heat-resistant layer 13, a stress caused by the thermal expansion of the substrate 11 is absorbed by the low-temperature softening layer 12, and occurrence of a crack and peeling in the dielectric layer 32 is prevented.

As described above, in the embodiment as well, the low-temperature softening layer 12 is formed between the substrate 11 and the dielectric layer 32. Consequently, in a manner similar to the first embodiment, the occurrence of a crack and peeling in the dielectric layer 32 can be prevented, and the excellent dielectric film 32 can be formed on the substrate 11 made of the organic material at high yield. Thus, a light and shock-resistant dielectric capacitor having excellent characteristics can be obtained.

Fourth Embodiment

Figure 6:
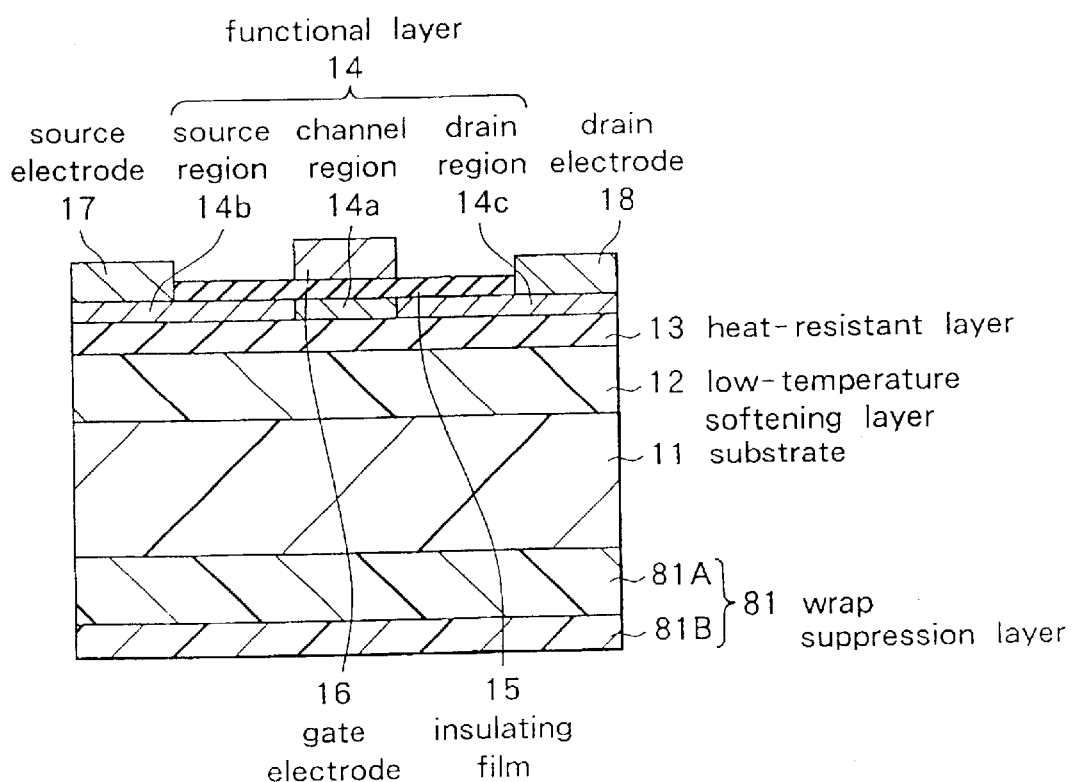
FIG. 6 is a cross section showing the configuration of a thin film transistor according to a fourth embodiment of the invention.

FIG. 6 shows a sectional configuration of a thin film transistor according to a fourth embodiment of the invention. According to the fourth embodiment, on the back side of the substrate 11 of the thin film transistor in the first embodiment, a warp suppression layer 81 to suppress a warp in the substrate 11 in association with the thermal expansion is provided. The same components as those in the first embodiment are designated by the same reference numerals and their description will not be repeated. Only different points will be described.

In the fourth embodiment, the warp suppression layer 81 takes the form of a composite layer of a polymer layer 81A made of an organic polymer and a heat-resistant layer 81B comprised of one or plural layers.

Preferably, the polymer layer 81A is made of the same polymer as that of the low-temperature softening layer 12 having the same thickness as that of the low-temperature softening layer 12. Desirably, in a manner similar to the heat-resistant layer 13, the heat-resistant layer 81B is also made of a material containing at least one selected from a group consisting of oxide, nitride, and oxynitride and formed with the same thickness as that of the heat-resistant layer 13. Obviously, the polymer layer 81A and the heat-resistant layer 81B may be made of materials different from those of the low-temperature softening layer 12 and the heat-resistant layer 13, respectively, as long as any of the above materials is used.

In a following functional layer fabricating process, it is important to satisfy the following conditions to suppress occurrence of a warp in the substrate 11 caused by a thermal stress using the warp suppression layer 81. Specifically, a thermal displacement ratio in a range from a room temperature to 150° C. at the time when the warp suppression layer 81 on the back side of the substrate 11 and the low-temperature softening layer 12 and the heat-resistant layer 13 are formed on the surface of the substrate 11 is set to 5% or lower. A thermal displacement ratio in a range from a room temperature to 150° C. at the time when the functional layer 14 is formed on the surface of the substrate 11 is set to 5% or lower. When each of the thermal displacement ratios is 5% or lower, the object can be achieved without a problem in each of the subsequent processes.

The thermal displacement ratio is defined in the specification as "a value calculated by (a/b)×100 where "a" denotes the maximum warp at each of temperatures when one end of the substrate is fixed to a reference surface and "b" denotes the maximum length of the substrate". 150° C. is set since the temperature is the upper limit from the process point of view when the substrate 11 is made of a plastic material.

In the thin film transistor of the embodiment, in the process (refer to FIG. 2A) of forming the low-temperature softening layer 12 and the heat-resistant layer 13 on the substrate 11 described in the first embodiment, when the same layers are simultaneously formed on the back side, the warp suppression layer 81 can be formed. The following processes of forming the amorphous silicon layer 21 and the functional layer 14, irradiation of the laser beam LB, and the like are similar to those of the first embodiment.

In the fourth embodiment, with the above configuration, in addition to the effect of the first embodiment, an effect such that the warp (curvature) of the substrate 11 caused by a difference in thermal coefficients of expansion between layers such as the substrate 11 and the functional layer 14 can be suppressed is obtained. In the fourth embodiment, the warp suppression layer 81 is constructed by the polymer layer 81A and the heat-resistant layer 81B. It is also possible to omit the heat-resistant layer 81B and construct the warp suppression layer 81 only by the polymer layer 81A.

Fifth Embodiment

Figure 7:
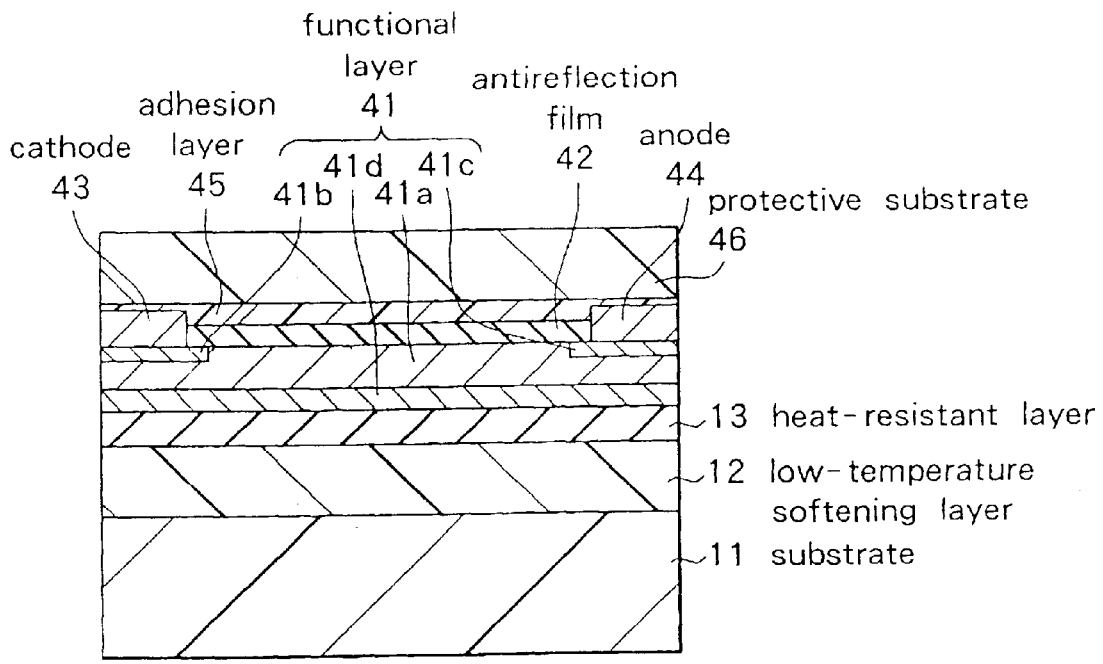
FIG. 7 is a cross section showing the configuration of a solar cell according to a fifth embodiment of the invention.

FIG. 7 shows a sectional configuration of a solar cell according to a fifth embodiment of the invention. The solar cell comprises, in a manner similar to the thin film transistor of the first embodiment, the substrate 11, low-temperature softening layer 12, and heat-resistant layer 13. The same components as those in the first embodiment are designated by the same reference numerals and their detailed description will not be repeated.

On the heat-resistant layer 13, for example, a functional layer 41 made of polysilicon is formed. The functional layer 41 has, for example, a p-type area 41a, an n$^+$ type area 41b provided on the p-type area 41a, and a p$^+$ type area 41c provided on the p-type area 41a and isolated from the n$^+$ type area 41b. The p-type area 41a has a thickness of, for example, about 1 μm to 49 μm and contains $1\times10^{15}$ to $1\times10^{18}$ atoms/cm$^3$ of a p-type impurity such as boron (B). The n$^+$ type area 41b has a thickness of, for example, about 0.05 μm to 1 μm and contains an n-type impurity such as phosphorus at a density as high as about $1\times10^{19}$ atoms/cm$^3$. The p$^+$ type area 41c has a thickness of, for example, about 0.05 μm to 1 μm and contains a p-type impurity such as boron at a density as high as about $1\times10^{19}$ atoms/cm$^3$.

The functional layer 41 has, for example, under the p-type area 41a, a p$^+$ type area 41d having a thickness of about 1 μm and containing a p-type impurity such as boron at a density as high as about $1\times10^{19}$ atoms/cm$^3$. The p$^+$ type area 41d is used to increase the photoelectric conversion efficiency by reflecting electrons generated in the p-type area 41a. By making the functional layer 41 of polysilicon, high doping efficiency is obtained, series resistance can be reduced, and photoelectric conversion efficiency can be increased.

On the functional layer 41, for example, an antireflection film 42 made of titanium oxide (TiO$_2$) is formed. An opening is formed in the antireflection film 42 in correspondence with the n$^+$ type area 41b, and a cathode 43 made of, for example, aluminum is electrically connected to the n$^+$ type area 41b via the opening. An opening corresponding to the p$^+$ type area 41c is also formed in the antireflection film 42, and an anode 44 made of, for example, aluminum is electrically connected to the p+ type area 41c via the opening. On the antireflection film 42, cathode 43, and anode 44, for example, a protective substrate 46 made of polyethylene terephthalate is disposed sandwiching an adhesion layer 45 made of ethylene-vinylacetate.

Figure 8:
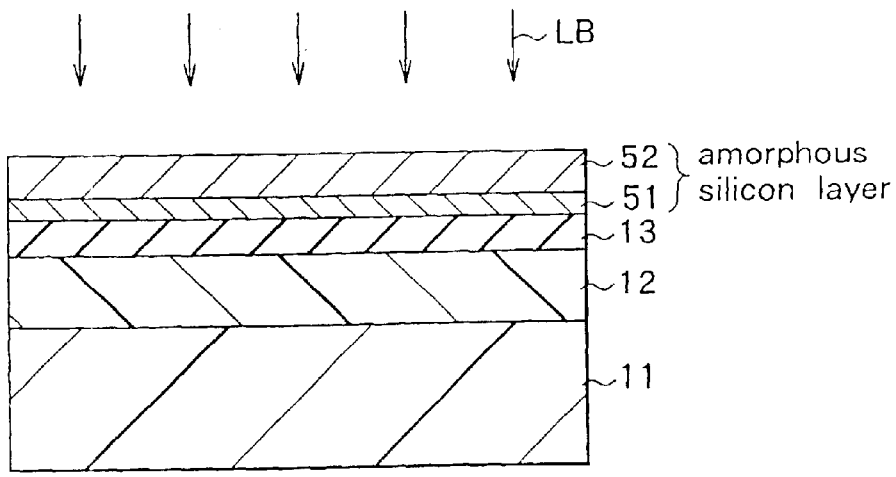
FIG. 8 is a cross section for explaining a manufacturing process of the solar cell shown in FIG. 7.

Referring now to FIGS. 7 and 8, a method of manufacturing the solar cell will be described.

First, as shown in FIG. 8, in a manner similar to the first embodiment, the low-temperature softening layer 12 and the heat-resistant layer 13 are sequentially formed on the substrate 11. On the heat-resistant layer 13, an amorphous silicon layer 51 is formed as a precursor layer of the functional layer 41 by, for example, sputtering. The amorphous silicon layer 51 is exposed, for example, in an atmosphere containing an ionized gas of diborane (B$_2$H$_6$) and is doped with boron (B).

On the amorphous silicon layer 51, for example, by sputtering, an amorphous silicon layer 52 is further formed as a precursor layer of the functional layer 41. After that, for example, the amorphous silicon layer 52 side is irradiated with the laser beam LB in the nitrogen gas atmosphere to thereby heat the amorphous silicon layers 51 and 52. By the operation, the amorphous silicon layers 51 and 52 are crystallized and become the functional layer 41. In this case, a portion corresponding to the amorphous silicon layer 51 becomes the p$^+$ type area 41d. The parameters of the laser beam are similar to those in the first embodiment. In the fifth embodiment as well, as described in the first embodiment, heat conduction to the substrate 11 is suppressed by the heat-resistant layer 13, the stress caused by thermal expansion of the substrate 11 is absorbed by the low-temperature softening layer 12, and occurrence of a crack and peeling is prevented.

As shown in FIG. 7, a part corresponding to the amorphous silicon layer 52 in the functional layer 41 is exposed to, for example, an atmosphere of an ionized gas of diborane, thereby forming the p-type area 41a. After that, for example, by using the lithography technique, a part of the p-type area 41a is exposed to the atmosphere containing the ionized gas of diborane to form the p$^+$ type area 41c. Further, for example, by using the lithography technique, a part of the p-type area 41a is exposed to an atmosphere containing an ionized gas of phosphine, thereby forming the n$^+$ type area 41b.

After forming the functional layer 41 as described above, on the functional layer 41, the antireflection film 42 is formed by, for example, sputtering, and openings are formed in correspondence with the n$^+$ type area 41b and the p$^+$ type area 41c. After that, for example, by sputtering, the cathode 43 and the anode 44 are formed in correspondence with the n$^+$ type area 41b and the p$^+$ type area 41c, respectively. Finally, on the antireflection film 42, the protective substrate 46 is adhered via the adhesive layer 45.

In the embodiment as well, the low-temperature softening layer 12 is formed between the substrate 11 and the functional layer 41. In a manner similar to the first embodiment, the occurrence of a crack and peeling in the functional layer 41 can be prevented, so that the excellent functional layer 41 made of polysilicon can be formed on the substrate 11 made of an organic material at high yield. Therefore, the light, shock-resistant solar cell having excellent characteristics can be easily obtained.

Further, concrete examples of the invention will be described in detail.

EXAMPLE 1

In Example 1, first, a substrate having a thickness of 200 μm made of polyethylene terephthalate was prepared. On the substrate, a composite polymer of butyl acrylate and isobutyl acrylate was applied to a thickness of about 20 μm, thereby forming a low-temperature softening layer. The substrate on which the low-temperature softening layer is formed was stamped in a disk shape having a diameter of about 10 cm, cleaned, and dried.

Subsequently, the substrate was disposed in a vacuum chamber, and the pressure in the chamber was set to about $1.3\times10^{-5}$ Pa by using a vacuum pump. After that, oxygen gas (O$_2$) and argon gas (Ar) were charged into the chamber, and a heat-resistant layer made of silicon dioxide was formed on the low-temperature softening layer to a thickness of about 300 nm by reactive sputtering. After forming the heat-resistant layer, argon gas was passed into the chamber and an amorphous silicon layer as a precursor layer was formed on the heat-resistant layer to a thickness of about 30 nm by sputtering. To form the heat-resistant layer and the amorphous silicon layer, a facing target system for applying a voltage between targets disposed on one sides was used.

Figure 9:
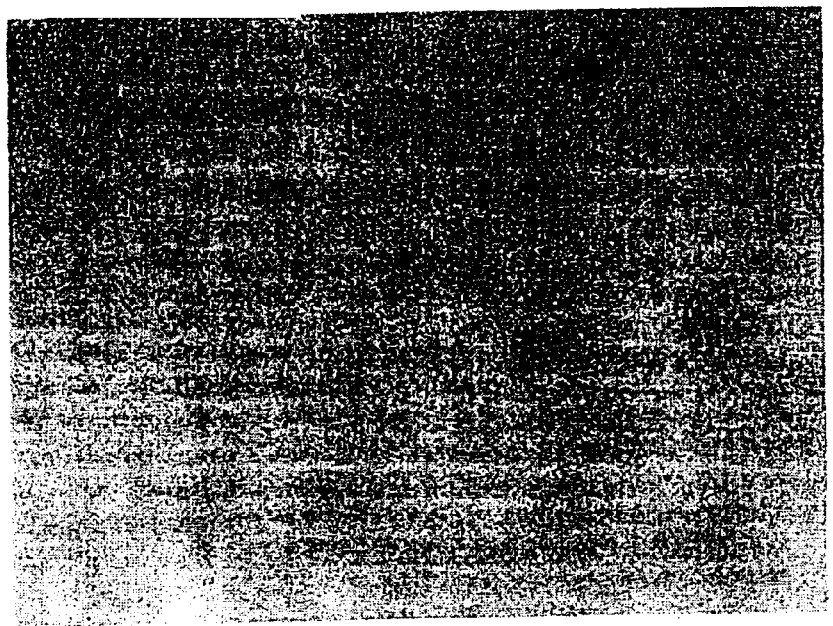
FIG. 9 is a microphotograph showing a state of a polysilicon layer according to a first example of the invention.

After forming the amorphous silicon layer, the substrate was taken out from the vacuum chamber, the amorphous silicon layer was irradiated with a line beam of an XeCl excimer laser with an energy density of 280 mJ/cm$^2$ at the maximum in the nitrogen as atmosphere and crystallized, thereby forming a polysilicon layer as the functional layer. After that, the polysilicon layer was observed at a magnification of 90 times by an optical microscope. The result is shown in FIG. 9. No crack and peeling is seen in the polysilicon layer, and an excellent crystal layer is formed.

Figure 10:
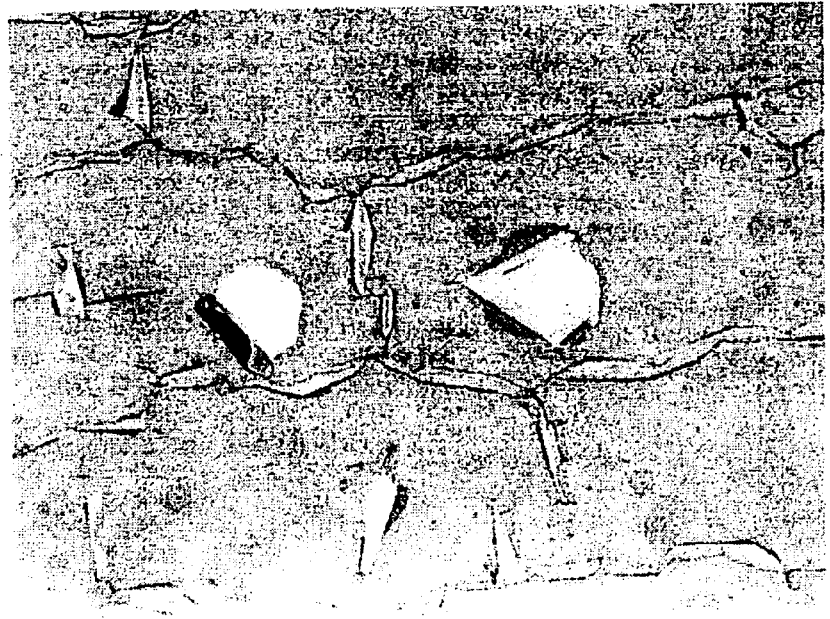
FIG. 10 is a microphotograph showing a state of a polysilicon layer according to a comparative example of the first example.

As a comparative example of Example 1, except that the low-temperature softening layer is not formed, the polysilicon layer was formed in a manner similar to Example 1. The polysilicon layer was also observed in a manner similar to Example 1. The result is shown in FIG. 10. A number of cracks are seen in the polysilicon layer and a part is completely peeled off.

It was understood that, by forming the low-temperature softening layer between the substrate and the amorphous silicon layer, even if the amorphous silicon layer is irradiated with a laser beam, an excellent polysilicon layer could be formed on the substrate made of an organic material without causing a crack and peeling.

EXAMPLE 2

Figure 11:
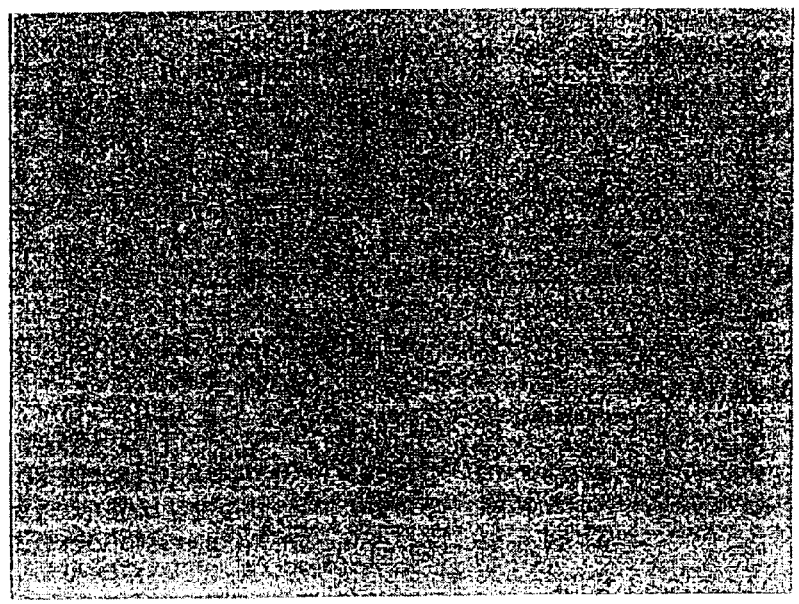
FIG. 11 is a microphotograph showing a state of a polysilicon layer according to a second example of the invention.

In this example, a polysilicon layer was formed in a manner similar to Example 1 except that an electrode made of aluminum was formed between the heat-resistant layer and the amorphous silicon layer. The polysilicon layer was also observed in a manner similar to Example 1. The result is shown in FIG. 11. No crack and peeling is seen in the polysilicon layer and an excellent crystal layer was formed.

Figure 12:
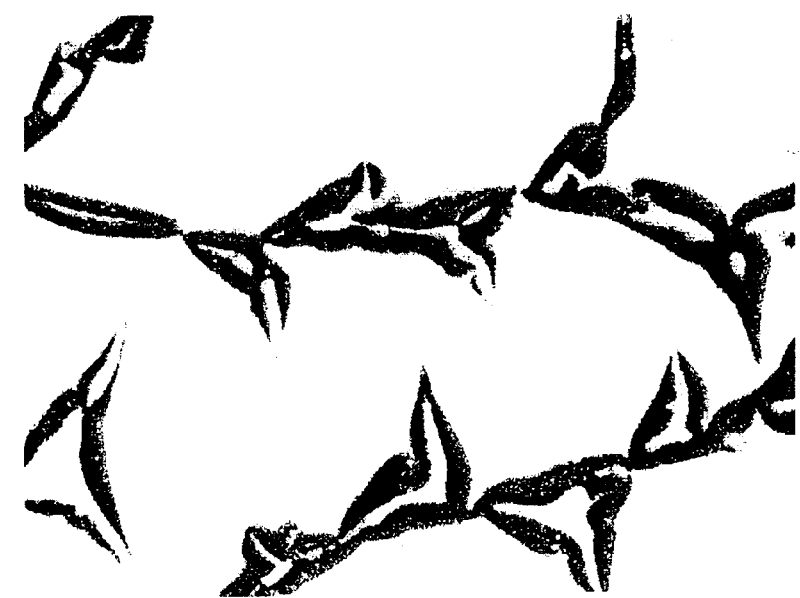
FIG. 12 is a microphotograph showing a state of a polysilicon layer according to a comparative example of the second example.

As a comparative example of Example 2, a polysilicon layer was formed in a manner similar to Example 2 except that no low-temperature softening layer was formed. The polysilicon layer was also observed in a manner similar to Example 1. The result is shown in FIG. 12. A number of cracks are seen in the polysilicon layer and a part was completely peeled off.

It was understood that, even when an electrode is formed between the amorphous silicon layer and the heat-resistant layer, in a manner similar to Example 1, the excellent polysilicon layer could be formed on the substrate made of an organic material.

EXAMPLE 3

In this example, the polysilicon layer was formed in a manner similar to Example 1 except that after forming the amorphous silicon layer, prior to irradiation of a laser beam, phosphorus was doped at a high density into the amorphous silicon layer. After carrying the substrate into a PECVD (Plasma Enhanced Chemical Vapor Deposition) chamber by using a load lock, the amorphous silicon layer was doped with phosphorus by exposing to plasma of a mixture gas of phosphine gas and hydrogen gas (Hs) containing 1% by volume of phosphine gas. The polysilicon layer was also observed in a manner similar to Example 1 and no cracks and peeling were found. It was understood that the excellent n-type polysilicon layer could be formed on the substrate made of an organic material.

EXAMPLE 4

In this example, a polysilicon layer was formed in a manner similar to Example 1 except that, after forming the amorphous silicon layer, boron was doped at high density into the amorphous silicon layer prior to irradiation of a laser beam. Boron was doped in a manner similar to Example 3 except that a diborane gas was used in place of a phosphine gas. The polysilicon layer was also observed in a manner similar to Example 1 and no crack and peeling was seen. That is, it was understood that the excellent p-type polysilicon layer could be formed on the substrate made of an organic material.

EXAMPLE 5

In this example, first, in a manner similar to Example 1, the low-temperature softening layer and the heat-resistant layer were sequentially formed on the substrate. Subsequently, in an argon gas atmosphere, a lower electrode made of ITO was formed on the heat-resistant layer by sputtering. On the lower electrode, a mainly amorphous-state oxide layer containing lead (Pb), titanium (Ti), and zirconium (Zr) was formed as a precursor layer by sputtering in the argon gas atmosphere at a room temperature. After that, in the argon gas atmosphere, an upper electrode made of ITO was formed on the oxide layer by sputtering. For formation of the lower electrode, oxide layer, and upper electrode, a facing target system was used.

After forming the upper electrode, the upper electrode side is irradiated with a line beam of an XeCl excimer laser at an energy density of 280 mJ/cm$^2$ at the maximum in the nitrogen gas atmosphere, the oxide layer was crystallized, and a dielectric layer was formed as a functional layer containing a polycrystal PZT. When the dielectric layer was observed in a manner similar to Example 1, no crack and peeling was seen. That is, it was understood that the excellent dielectric layer could be formed on the substrate made of an organic material.

EXAMPLE 6

In this example, a polysilicon layer was formed in a manner similar to Example 1 except that a substrate made of PES (polyether sulfone) having a thickness of 200 μm was used. When the polysilicon layer was observed in a manner similar to Example 1, no crack and peeling was seen. That is, it could be confirmed that an effect similar to that of Example 1 can be obtained also in the case where the low-temperature softening layer is made of the other material.

EXAMPLE 7

In this example, a polysilicon layer was formed in a manner similar to Example 2 except that a substrate made of PES (polyether sulfone) having a thickness of 200 μm was used. When the polysilicon layer was observed in a manner similar to Example 1, no crack and peeling was seen. That is, it could be confirmed that an effect similar to that of Example 2 can be obtained also in the case where the low-temperature softening layer is made of the other material.

EXAMPLE 8

An n-type polysilicon layer was formed in a manner similar to Example 3 except that a substrate made of PES (polyether sulfone) having a thickness of 200 μm was used. When the polysilicon was observed in a manner similar to Example 1, no crack and peeling was seen. That is, it could be confirmed that an effect similar to that of Example 3 can be obtained also in the case where the low-temperature softening layer is made of other material.

EXAMPLE 9

In this example, a p-type polysilicon layer was formed in a manner similar to EXAMPLE 4 except that a substrate made of PES (polyether sulfone) having a thickness of 200 $\mu$m was used. When the polysilicon was observed in a manner similar to Example 1, no crack and peeling was seen. That is, it could be confirmed that an effect similar to that of EXAMPLE 4 can be obtained in also in the case where the low-temperature softening layer is made of the other material.

EXAMPLE 10

In this example, a disk-shaped substrate was obtained in a manner similar to Example 1 except that the heat-resistant layer made of silicon nitride ($Si_3N_4$) was formed to a thickness of 20 nm by reactive sputtering on the substrate before forming the low-temperature softening layer. Subsequently, a polysilicon layer was formed in a manner similar to Example 1 except that a heat-resistant layer made of silicon dioxide was formed to a thickness of 30 nm, an amorphous silicon layer was formed in a helium gas (He), and then the amorphous silicon layer was irradiated at an energy density of 300 mJ/cm$^2$ at the maximum with an XeCl excimer laser beam.

When the polysilicon layer was observed in a manner similar to Example 1, no crack and peeling was seen. That is, it could be confirmed that, by further forming the heat-resistant layer between the substrate and the low-temperature softening layer, even when the amorphous silicon layer is irradiated with an energy beam of higher intensity, an effect similar to that of Example 1 can be obtained.

EXAMPLE 11

In this example, a disk-shaped substrate was prepared in a manner similar to Example 10 except that a heat-resistant layer formed prior to the low-temperature softening layer was made of silicon dioxide. Subsequently, a polysilicon layer was formed in a manner similar to Example 10 except that a metal layer made of aluminum (Al) was formed to a thickness of 50 nm by DC sputtering prior to the heat-resistant layer formation and an amorphous silicon layer was irradiated with an XeCl excimer laser at an energy density of 310 mJ/cm$^2$ at the maximum.

When the polysilicon layer was also observed in a manner similar to Example 1, no crack and peeling was seen. That is, it was confirmed that, by forming a heat-resistant layer between the substrate and the low-temperature softening layer, and sequentially forming a metal layer and a heat-resistant layer on the low-temperature softening layer, also in the case where the amorphous silicon layer was irradiated with an energy beam of higher intensity, an effect similar to that in Example 1 can be obtained.

From the result of the Example, it was understood that by forming the low-temperature softening layer between the substrate and the precursor layer, even when the precursor layer is irradiated with a laser beam, an excellent functional layer could be formed on the substrate made of an organic material without causing cracks and peeling. It was confirmed that, by inserting a plurality of heat-resistant layers and metal layers between the substrate and the precursor layer as in Examples 10 and 11, even when the precursor is irradiated with an energy beam of higher intensity, a similar effect is obtained and crystallinity of the functional layer can be improved.

EXAMPLE 12

Figure 13:
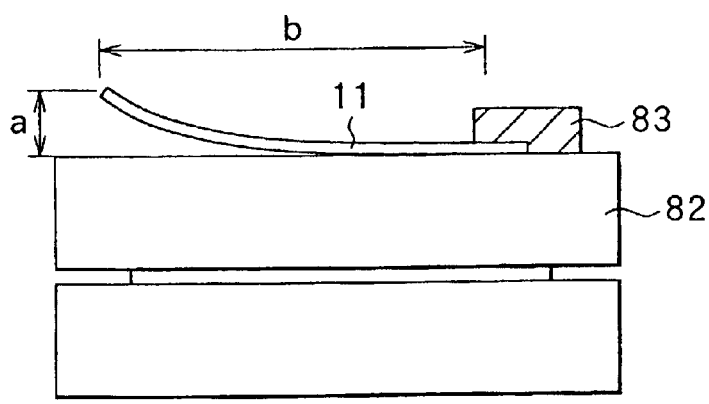
FIG. 13 is a diagram for explaining examples 12 and 13.
Figure 14:
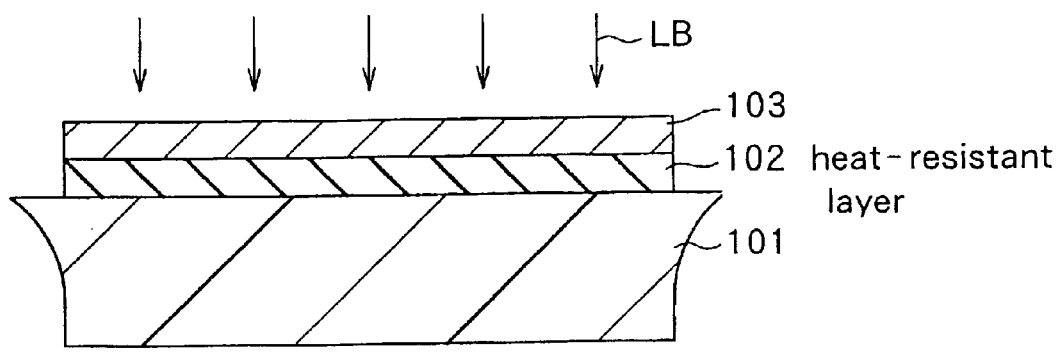
FIG. 14 is a cross section for explaining conventional problems.

In this example, a substrate having a thickness of 180 $\mu$m and a length of 10 cm made of PET (polyethylene terephthalate) in which an acrylic resin (low-temperature softening layer) was applied to 10 $\mu$m on its top surface and a silicon oxide (heat-resistant layer) having a film thickness of 0.3 $\mu$m was formed on the acrylic resin, and an acrylic resin (warp suppress layer) was applied to 10 $\mu$m on the back side of the substrate was prepared. As a comparative example, the same substrate except that the warp suppression layer is not formed on the back side of the substrate was prepared. As shown in FIG. 13, each of those substrates 11 was placed on a hot plate 82. In a state where one end of the substrate 11 is fixed by a weight 83, the substrate 11 was heated from a room temperature to 120° C. As a result, although the thermal displacement ratio was 30% (a=21 mm and b=7 cm) in the comparative example, the thermal displacement ratio of this example was 0% (a=0 mm and b=7 cm). That is, no warp was observed.

EXAMPLE 13

In this example, a substrate having a thickness of 180 $\mu$m and a length of 10 cm made of PET (polyethylene terephthalate) in which an acrylic resin (low-temperature softening layer) was applied to 10 $\mu$m on its top surface, a silicon oxide (heat-resistant layer) having a film thickness of 0.3 $\mu$m and a polysilicon film (function film) having a film thickness of 0.04 $\mu$m were formed on the acrylic resin, and an acrylic resin (warp suppress layer) was applied to 10 $\mu$m on the back side was prepared. As a comparative example, the same substrate except that the warp suppression layer is not formed on the back side of the substrate was prepared. Each of those substrates 11 was heated from a room temperature to 150° C. by the method shown in FIG. 13. As a result, in the comparative example, the thermal displacement ratio was 19% (a=13 mm and b=7 cm). In contrast, the thermal displacement ratio of this example was 0% (a=0 mm and b=7 cm). That is, no warp was observed.

Although the present invention has been described above by the embodiments and examples, the invention is not limited to the foregoing embodiments and examples but can be variously modified. For example, the case where the functional layers 14 and 41 are made of silicon has been described in the first and third embodiments. The functional layers 14 and 41 may be made of other semiconductors including silicon such as silicon germanium. The invention can be also applied to a case where the functional layer is made of other semiconductor such as III-V compound semiconductor.

Further, in the second embodiment, the example where the dielectric layer 32 is made of a ferroelectric material has been described. The dielectric layer 32 may be made of a high dielectric material.

Further, in the foregoing embodiments and examples, the functional layer is made of polycrystal. However, the invention can be widely applied also to the case where the functional layer is in a crystalline state of single crystal, crystallite, or the like. That is, the invention can be widely applied to the case where the functional layer has crystallinity. The functional layer may have crystallinity in at least a part like a composite body of polycrystal and amorphous.

In addition, the foregoing embodiments and examples have been described with respect to the case where the heat-resistant layer is made of silicon oxide, silicon nitride, or silicon oxynitride. Instead of the materials or with the materials, at least one of oxide, nitride, or oxynitride of, for example, aluminum, zirconium, or the like may be contained.

Further, in the foregoing embodiments and examples, the precursor layer is irradiated with a laser beam. Instead, other energy beams such as electron beam may be used.

Moreover, although the functional device has been concretely described as an example in the foregoing embodiments, the invention can be widely applied to a functional device as long as a heat-resistant layer is provided between a substrate and a functional layer and a low-temperature softening layer is provided between the heat-resistant layer and the substrate. For example, the invention can be applied to memories such as FeRAM (Ferroelectric Random Access Memories) and functional devices other than a dielectric capacitor having a functional layer containing an oxide.

Further, although the embodiments have been described with respect to the functional device comprising the substrate 11, the substrate 11 may be removed after fabricating the functional device. The invention can be applied also to a functional device which does not comprise the substrate 11.

As described above, in the functional device or the method of manufacturing the functional device according to the invention, the low-temperature softening layer is provided between the functional layer and the substrate. Consequently, for example, even if an energy beam is irradiated to form the functional layer, the stress caused by the thermal expansion of the substrate can be absorbed by the low-temperature softening layer, so that occurrence of cracks and peeling in the functional layer can be prevented. As a result, the substrate made of, for example, an organic material can be used. An effect such that the light, shock-resistant functional device having excellent characteristics can be obtained is produced.

Further, in the invention, by providing the warp suppression layer on the surface of the substrate opposite to the surface on which the functional layer is provided, a warp caused by thermal deformation of the substrate can be effectively suppressed.

In the functional device according to another aspect of the invention, the low-temperature softening layer is provided on one of the surfaces of the functional layer. Even when the energy beam is irradiated to form the functional layer, the stress caused by the thermal expansion can be absorbed by the low-temperature softening layer, so that the occurrence of cracks and peeling in the functional layer can be prevented. Therefore, the substrate made of an organic material having a high thermal expansion coefficient can be used.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a functional device in which a functional layer is provided on a substrate, comprising the steps of:

forming a low-temperature softening layer having a softening temperature lower than that of a substrate on the substrate;

forming a heat-resistant layer which is a single layer or constructed by a plurality of layers on the low-temperature softening layer; and forming the functional layer on the heat-resistant layer.

2. A method of manufacturing a functional device according to claim 1, further comprising a step of forming other heat-resistant layer, different from the heat-resistant layer, which is a single layer or constructed by a plurality of layers on the substrate before the low-temperature softening layer is formed.

3. A method of manufacturing a functional device according to claim 1, further comprising a step of forming a metal layer which is a single layer or constructed by a plurality of layers on the low-temperature softening layer before the heat-resistant layer is formed.

4. A method of manufacturing a functional device according to claim 1, wherein the step of forming the functional layer includes the steps of:

forming a precursor layer of the functional layer on the heat-resistant layer; and forming a functional layer by irradiating the precursor layer with an energy beam.

5. A method of manufacturing a functional device according to claim 4, wherein the precursor layer is crystallized by being irradiated with an energy beam.

6. A method of manufacturing a functional device according to claim 4, wherein a laser beam is used as an energy beam.

7. A method of manufacturing a functional device according to claim 6, wherein a laser beam of a short wavelength having an energy density of 80 mJ/cm$^2$ or higher is applied.

8. A method of manufacturing a functional device according to claim 1, further comprising a step of forming an electrode for the functional layer between the heat-resistant layer and the functional layer.

9. A method of manufacturing a functional device in which a functional layer is provided on a substrate, comprising the steps of:

forming a warp suppression layer for suppressing a warp in the substrate on the back side of the substrate;

forming a low-temperature softening layer having a softening temperature lower than that of the substrate on the surface of the substrate;

forming a heat-resistant layer which is a single layer or constructed by a plurality of layers on the low-temperature softening layer; and forming the functional layer on the heat-resistant layer.

10. A method of manufacturing a functional device according to claim 9, wherein a thermal displacement ratio in a range from a room temperature to 150° C. at the time when the warp suppression layer is formed on the back side of the substrate and the low-temperature softening layer and the heat-resistant layer are formed on the surface of the substrate is set to 5% or lower.

11. A method of manufacturing a functional device according to claim 9, wherein a thermal displacement ratio in a range from a room temperature to 150° C. at the time when the warp suppression layer is formed on the back side of the substrate, and the low-temperature softening layer, the heat-resistant layer, and the functional layer are formed on the surface of the substrate is set to 5% or lower.

12. A method of manufacturing a functional device according to claim 9, further comprising a step of forming a metal layer which is a single layer or constructed by a plurality of layers on the low-temperature softening layer before the heat-resistant layer is formed.

13. A method of manufacturing a functional device according to claim 9, wherein the step of forming the functional layer includes the steps of:

forming a precursor layer of the functional layer on a heat-resistant layer; and forming the functional layer by irradiating the precursor layer with an energy beam.

14. A method of manufacturing a functional device according to claim 13, wherein the precursor layer is crystallized by being irradiated with an energy beam.

15. A method of manufacturing a functional device according to claim 13, wherein a laser beam is used as an energy beam.

16. A method of manufacturing a functional device according to claim 15, wherein a laser beam of a short wavelength having an energy density of 80 mJ/cm² or higher is applied.

17. A method of manufacturing a functional device according to claim 9, further comprising a step of forming an electrode for the functional layer between the heat-resistant layer and the functional layer.

* * * * *